United States Patent [19]
Takenaka

[11] Patent Number: 5,923,620
[45] Date of Patent: Jul. 13, 1999

[54] MODULE STRUCTURE AND ELECTRONIC DEVICE

[75] Inventor: Hiroshi Takenaka, Iruma, Japan

[73] Assignee: Casio Computer Co., Ltd., Tokyo, Japan

[21] Appl. No.: 08/855,928

[22] Filed: May 14, 1997

[30] Foreign Application Priority Data

May 16, 1996 [JP] Japan .................................. 8-121450

[51] Int. Cl.$^6$ ........................ G04B 37/00; G04C 23/02; H05K 5/00
[52] U.S. Cl. ........................ 368/88; 361/752; 361/756
[58] Field of Search .................. 368/82–84, 85, 368/87, 88, 223, 276, 294–296, 299, 300; 361/748–756, 736, 741, 747

[56] References Cited

U.S. PATENT DOCUMENTS

| | | | |
|---|---|---|---|
| 3,846,971 | 11/1974 | Ho et al. .................. | 368/388 |
| 3,863,436 | 2/1975 | Schuartzschild et al. ........ | 368/88 |
| 4,095,412 | 6/1978 | Burke ........................ | 368/88 |
| 4,199,577 | 4/1980 | Ohno et al. ................ | 368/82 |
| 4,555,184 | 11/1985 | Fusimori .................... | 368/88 |

FOREIGN PATENT DOCUMENTS

| | | | |
|---|---|---|---|
| 58-35488 | 2/1987 | Japan ....................... | 368/318 |
| 08-36673 | 5/1996 | Japan . | |

*Primary Examiner*—Vit Miska
*Attorney, Agent, or Firm*—Frishauf, Holtz, Goodman, Langer & Chick

[57] ABSTRACT

A baseplate-free module includes a circuit board 1 held between housings 41 and 42. The circuit board 1 has engaging holes 17 in which hooks 41a, 42a of the housings 41 and 42 are engaged for assembling purposes to thereby eliminate the need for a baseplate.

12 Claims, 8 Drawing Sheets

MODULE STRUCTURE AND ELECTRONIC DEVICE

BACKGROUND OF THE INVENTION

The present invention relates to the structure of a module to be incorporated, for example, into an electronic timepiece, and to electronic devices including such module.

A circuit board is incorporated into a module for an electronic timepiece. The circuit board includes a glass epoxy board on which a circuit pattern is formed by printing. In order to connect the circuit board to another member such as a battery incorporated into a module or still another member such as a piezoelectric element incorporated into the body of the timepiece, connection members such as conductive coil springs and/or conductive plates are required. Thus, many parts are contained in the module and are troublesome to assemble.

The applicants have filed a Japanese patent application Hei 6-274689 for a module in which a connection member such as the coil spring was mentioned above is eliminated by fabricating a circuit board using a metal core (this application was published May 31, 1996; publication No. 8-136673).

This module mainly comprises the circuit board, which has a metal core covered with an insulating layer on which a circuit pattern is formed and covered with a resist layer.

The circuit board is held fixedly between an upper and a lower insulating housing. This circuit board and a liquid crystal display member are connected by an interconnector.

Such module is generally assembled using a baseplate. The baseplate assembles the upper and lower housings thereon and maintains the assembled state of the module.

In addition, the baseplate is also used as a switching member. In the case of an electronic timepiece in which such module is provided, in order to transmit to the circuit board the depression of a push button provided on the timepiece body to switch among function of the timepiece, a movable plate-like contact attached to the baseplate is required to be disposed between the push button and the circuit board.

In a module structure of the type mentioned above, in order to ensure proper assembly and to enable use as a switching member, the ground plate is a necessary element that cannot be eliminated. Therefore, the number of parts of the module would increase accordingly to complicate the module structure and the module is troublesome to assemble. In addition, the module would increase in thickness by a quantity corresponding to the thickness of the baseplate.

The present invention intends to eliminate such problems. More specifically, it is an object of the present invention to provide a module structure which can be assembled without using a baseplate and which has a reduced number of components and thinned structure, and an electronic device having such module structure.

In order to achieve the above object, the present invention provides a module structure comprising a circuit board and a pair of housings between which the circuit board is disposed, the circuit board comprising a metal core; an insulating layer disposed on the core so as to cover same; a plurality of circuits formed on the insulating layer; and first engaging means. In addition, at least one of the housings includes second engaging means formed thereon so as to be engaged with the first engaging means for fixing the circuit board to that housing.

The present invention also provides an electronic device comprising a body and a module attached to the body, the module comprising a circuit board and a plurality of housings between which the circuit board is disposed, the circuit board comprising a metal core; an insulating layer disposed on the core so as to cover same; a plurality of circuits formed on the insulating layer; and first engaging means. In addition, at least one of the housings includes second engaging means formed thereon so as to be engaged with the first engaging means for fixing the circuit board to that housing.

DESCRIPTION OF THE PREFERRED EMBODIMENTS

Figure 10:
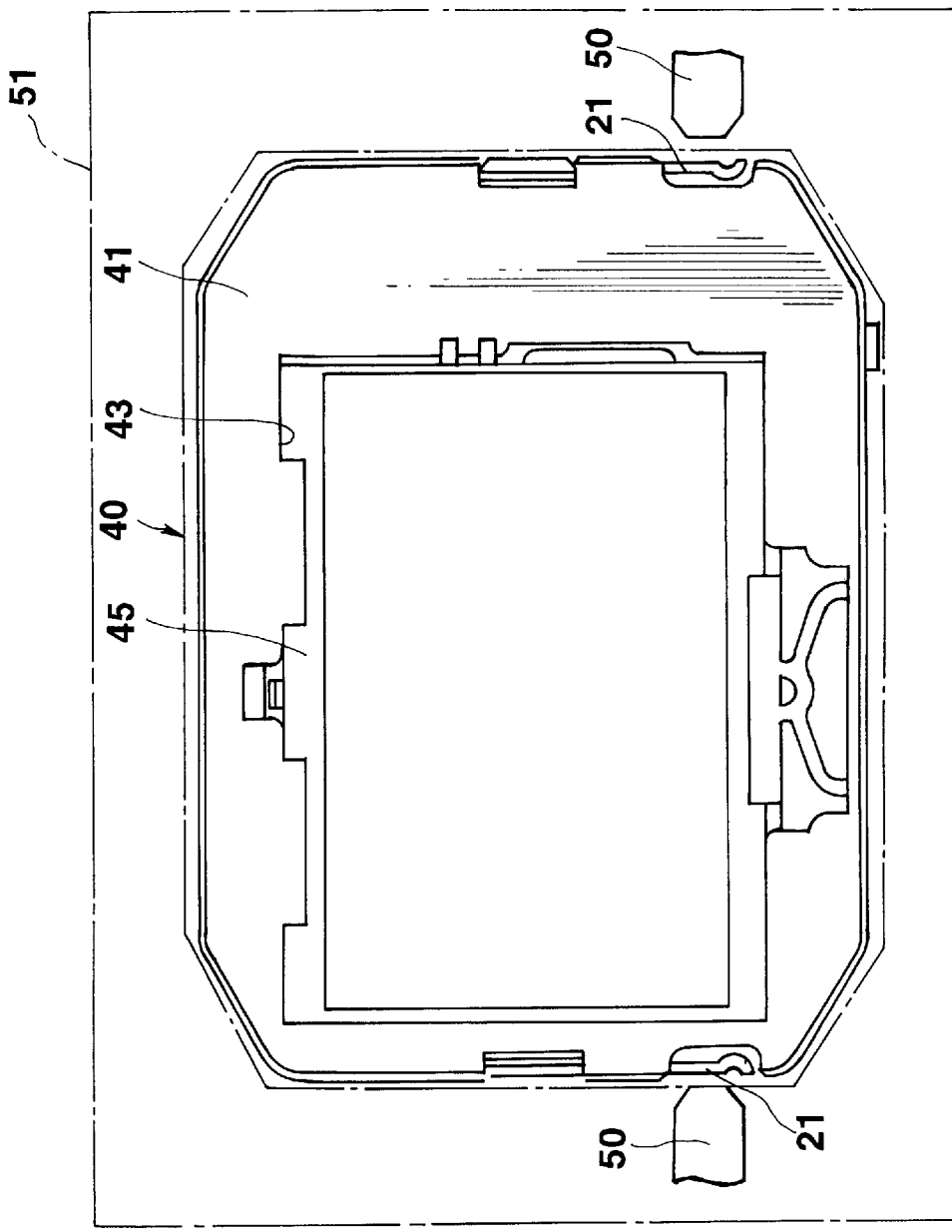
FIG. 10 is a plan view of an embodiment of a module according to the present invention.
Figure 12:
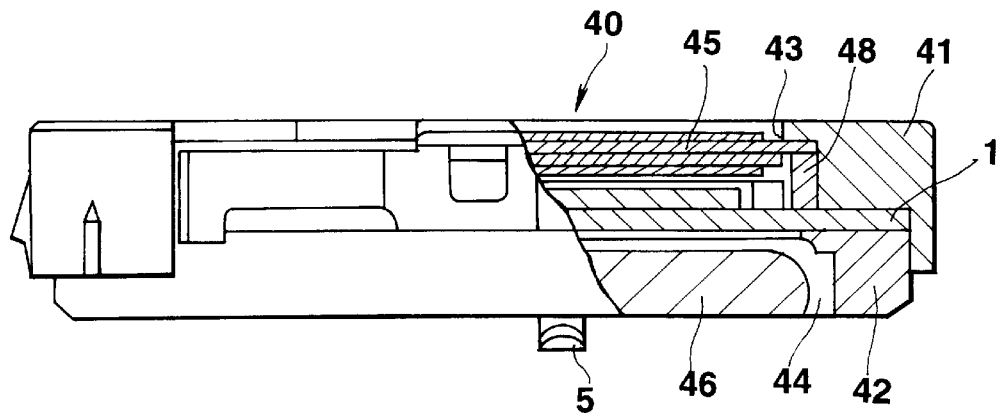
FIG. 12 is a partially broken-away side view of the module of FIG. 10.
Figure 13:
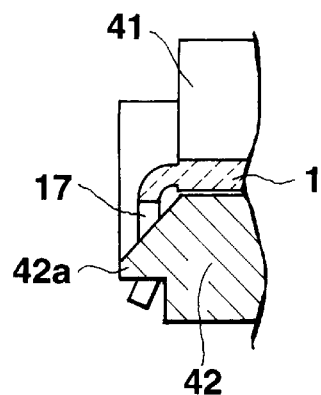
FIG. 13 is an enlarged cross-sectional view of the module taken along a line XIII—XIII of FIG. 11, showing an engaged hole in which a hook is engaged.
Figure 14:
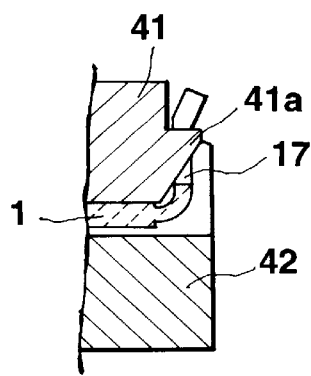
FIG. 14 is an enlarged cross-sectional view of the module taken along a line XIV—XIV of FIG. 11, showing an engaged hole in which a hook is engaged.

An electronic wristwatch as an embodiment of the present invention will be outlined next. The electronic wristwatch includes a main body 51 and a module 40 attached to the main body 51 (FIG. 10). The module includes a circuit board 1 and an upper housing 41 and a lower housing 42 which hold the circuit board 1 between the housings 41 and 42 (FIG. 12). The circuit board 1 includes a plate-like metal core 10, an insulating layer 11 covering an upper and a lower surface of the plate-like core 10, circuits 12 and 14 formed on the insulating layer 11 (FIG. 4), and has a first engaging means (hole) 17 (FIG. 5) engaged with second engaging means 41a (or 42a) of at least one of the housings 41, 42 (FIGS. 13, 14).

Figure 4:
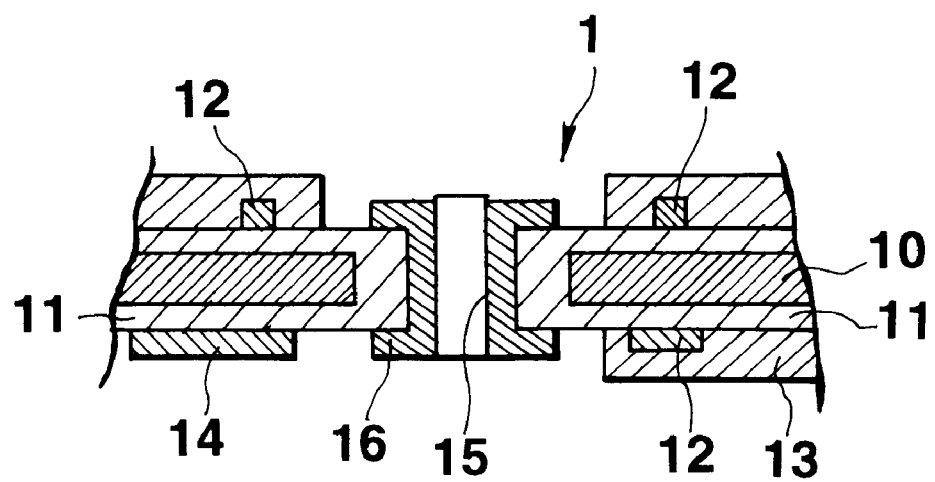
FIG. 4 is an enlarged cross-sectional view of an essential portion of a basic structure of the circuit board.

The circuit board 1 has a throughhole 15 in which a hollow conductor 16 is provided to electrically connect the circuits 12 and 14 provided on the insulating layers 11 (FIG. 4).

Figure 8:
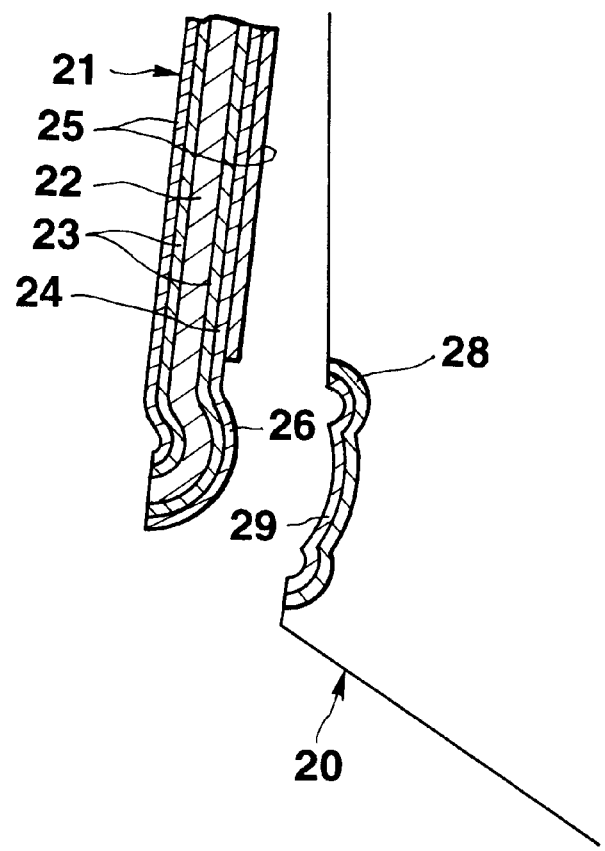
FIG. 8 is an enlarged cross-sectional view of an essential portion of a switching member shown in a circle B of FIG. 2.

The circuit board 1 further includes a resilient switch member 21 which is contactable with a fixed contact 29 provided on the body 20 of the circuit board (FIG. 8). The switch member 21 has a core which is the metal core 10 of the circuit board 1 and has a movable contact 26 at a position facing the fixed contact 29 (FIG. 10).

Now, the structure of the embodiments of the present invention will be described below in detail.

Figure 1:
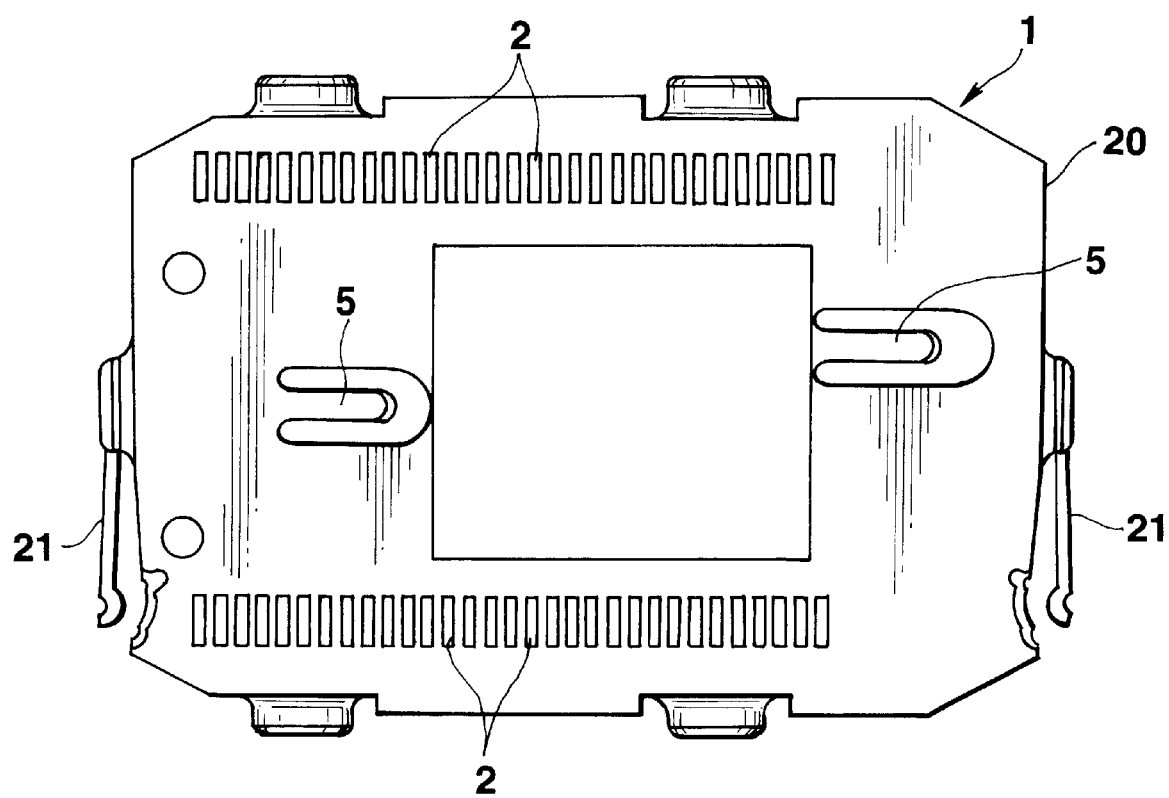
FIG. 1 is a plan view of a circuit board used in an embodiment of the present invention.
Figure 2:
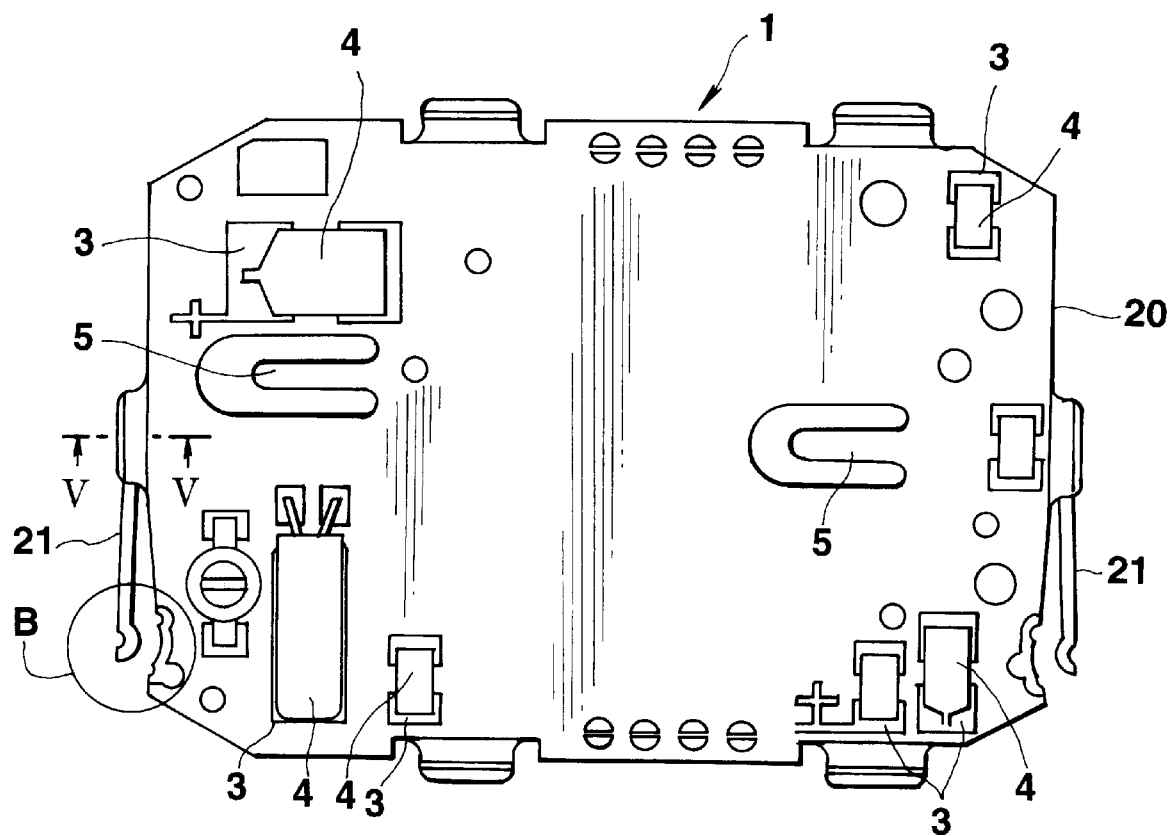
FIG. 2 is a bottom view of the circuit board.
Figure 3:
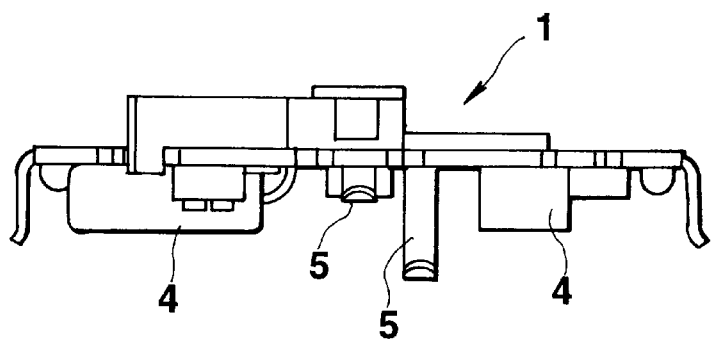
FIG. 3 is a side view of the circuit board.

FIG. 1 is a plan view of a circuit board used in an electronic wristwatch as an embodiment of the present invention. FIG. 2 is a bottom view of the circuit board. FIG. 3 is a side view of the circuit board.

As shown in FIG. 1, a line-like array of contact electrodes 2 to output a display signal to a display unit 45 (FIG. 10) of a module 40 to be described later in more detail is exposed on an upper surface of a circuit board 1.

As shown in FIG. 2, like the array of contact electrodes 2, lands 3 are formed in an exposed and dispersed manner on a lower surface of the circuit board 1. Provided on those land 3 are various external parts 4 (FIG. 3) such as an IC, capacitor and/or resistor chip.

The circuit board 1 has two U-like openings to define corresponding tongues 5 bent downward to impart resiliency thereto. A connection electrode is exposed. Thus, by bringing the tongue 5 into contact with parts such as a battery, piezoelectric element, etc., the circuit board 1 is electrically connected to those parts.

The circuit board 1 uses a metal or conductive core 10. FIG. 4 shows the cross-sectional structure of an essential portion of the circuit board 1. As shown in FIG. 4, an upper and lower surface of the metal core 10 is each covered with an insulating layer, on which a circuit pattern 12 is formed. The circuit pattern 12 is then covered with an insulating resist layer 13.

An exposed circuit 14 formed on the insulating layer 11 faces the line-like array of contact electrodes 2, lands 3. The circuit board has a throughhole 15 in which a conductive connection 16 is formed to electrically connect an upper and a lower circuit portion.

The structure of FIG. 4 applies to the whole circuit board 1.

Figure 5:
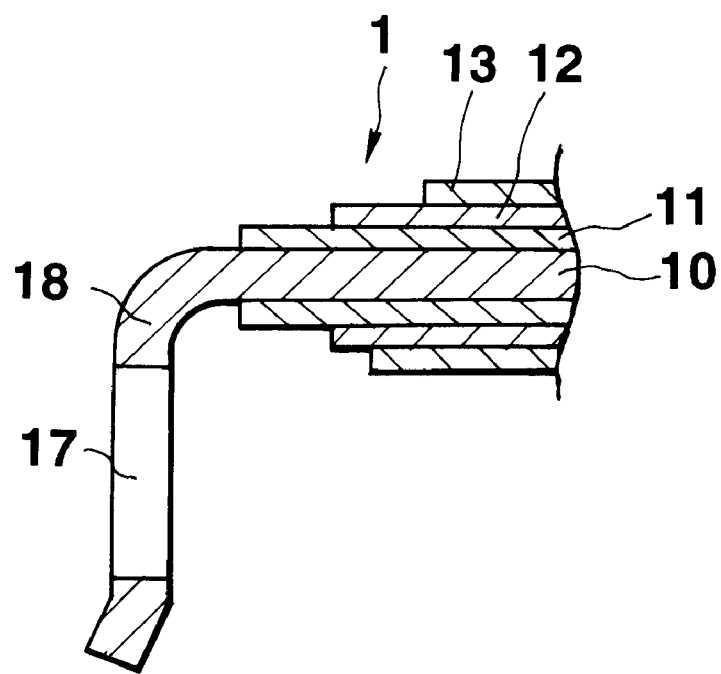
FIG. 5 is an enlarged cross-sectional view of an essential portion of an engaging hole taken along a line V—V of FIG. 2.

FIG. 5 shows the peripheral portion of the circuit board 1, in which a first engaging means (hole 17) is formed in a bent portion 18 formed in the vicinity of the periphery of the circuit board by bending the core portion 10 downwardly or upwardly. The hole 17 is engaged by an upper housing 41 or a lower housing 42 (FIGS. 12–14). To this end, the portion 18 is bent toward the corresponding housing portion.

Figure 6:
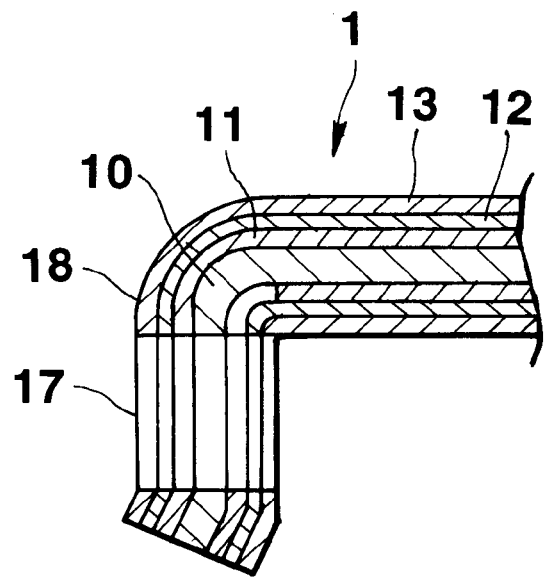
FIG. 6 is an enlarged cross-sectional view of an essential portion of another embodiment of an engaging hole providing member.
Figure 7:
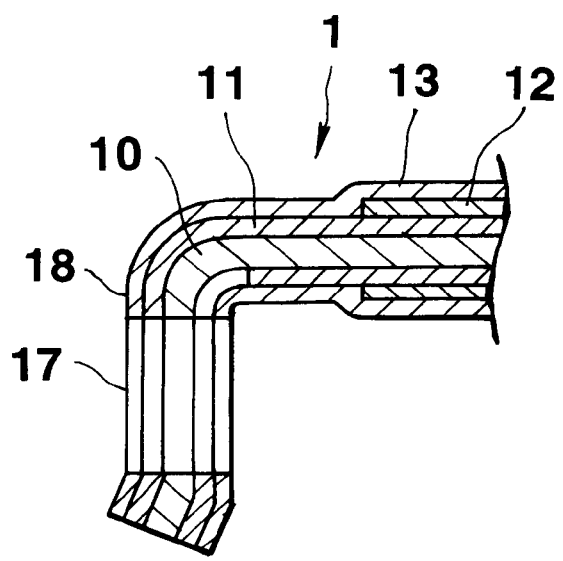
FIG. 7 is an enlarged cross-sectional view of an essential portion of still another embodiment of an engaging hole providing member.

FIGS. 6 and 7 show another structure which defines the first engaging means (hole 17). In FIG. 6, a circuit 12 on the insulating layer 11 reaches the hole 17 whereas in FIG. 7 a circuit 12 fails to reach the hole 17, which is a matter of choice depending on design.

As described above, the circuit board 1 is directly engaged with housings 41 or 42 with the aid of the engaging hole 17 in the core 10 as shown in FIGS. 5–7. Thus, no baseplate is required in the module assembling.

In another embodiment of the present invention, the circuit board 1 comprises a body 20 which fulfills the original function of the circuit board and in which the first engaging means (hole 17) and the circuit 12 are formed, and a switch member 21, for example, disposed on and attached at one end to each of opposing sides of the body 20. The free end portion of the switch member 21 is resiliently movable toward/away from the body 20, for example, in FIGS. 1 and 2. FIG. 8 shows an enlarged cross-sectional structure of the essential portion of the switch member 21. The body of the switch member 21 has a metal core 22 like the body 20. The metal core 22 is covered at an upper and a lower surface with corresponding insulating layers 23 on an appropriate one of which a circuit 24 is formed. The circuit 24 is then covered with a resist layer 25. The body 20 side end portion of the circuit 24 of the switch member 21 is exposed or free from a resist layer 25 and functions as a movable contact 26.

An insulating layer 28 is formed at a position on the body 20 which faces the movable contact 26 of the switch member 21 and a circuit portion or fixed contact 29 of the body 20 side which will be brought into contact with the movable contact 26 of the switch member 21 is formed on the insulating layer 28.

A push button 50 (FIGS. 10 and 11) provided on the timepiece body 51 faces the switch member 21 of the circuit board 1. When the push button 50 is pressed, it pushes the switch member 21 against the body 20. Thus, the movable contact 26 is brought into contact with the fixed contact 29 to thereby input/output a signal.

According to this embodiment, the circuit board 1 itself has the switching function, so that no movable contact for performing a switching operation is required to be attached to the baseplate, and the baseplate is not required, and accordingly, the number of parts of the module is reduced.

Figure 9:
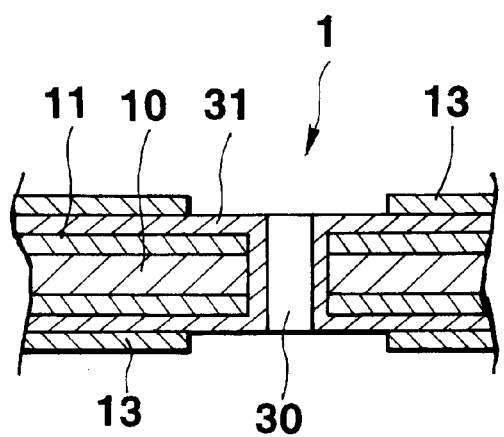
FIG. 9 is an enlarged cross-sectional view of the essential portion of the vicinity of a throughhole in the circuit board.

FIG. 9 shows a further embodiment in which a throughhole 30 is formed in a circuit board at a position different from that of the throughhole 15 of FIG. 4. Also, at the position of the throughhole 30, core 10 is covered with an insulating layer 11, on which a circuit 31 is formed and covered with a resist layer 13.

The core 10 is not covered with an insulating layer in the throughhole 30. The throughhole 30 is filled with a conductive material so as to continue to the circuit 31 to thereby ensure electrical conduction between the circuit 31 and the core 10. By employing such structure, the core 10 can be used as providing a drive or ground potential of the circuit 31 and no components which would otherwise be required for achieving those purposes are required.

Figure 11:
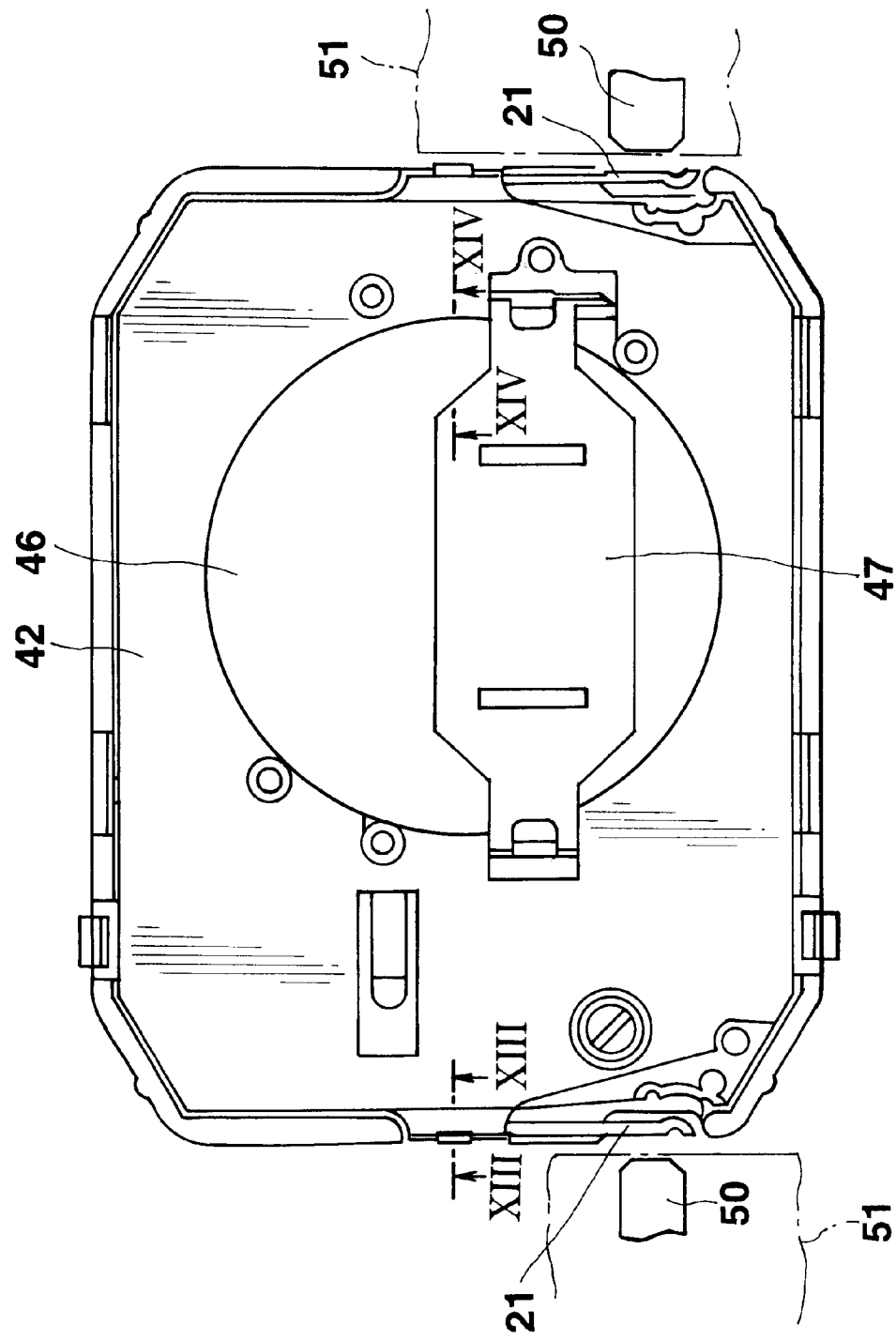
FIG. 11 is a bottom view of the module of FIG. 10.

FIGS. 10–12 show a module 40 which employs the above-mentioned circuit board 1. As shown in FIG. 12, the module 40 has an upper housing 41 and a lower housing 42 in the form of a synthetic resin plate between which the circuit board 1 is held.

An opening 43 is formed in a substantially central portion of the upper housing 41. A display member 45 which displays time with a liquid crystal is disposed within the opening 43. The display member 45 Is electrically connected through an interconnector 48 to the circuit board 1 for displaying purposes.

The lower housing 42 has a recess 44 in which a button-like cell 46 is received. As shown in FIG. 11, a cell support plate 47 provided to the lower housing 42 and extending across the recess 55 prevents the cell 46 from dropping off the recess 55.

In the module 40, engaging means (holes) 17 formed in the circuit board 1 are engaged by second engaging means (hooks) 41a or 42a provided in the vicinity of the peripheries the upper and the lower housings 41 and 42, as shown in FIGS. 13 and 14, to thereby ensure module assembling.

Thus, no baseplate on which the module is assembled is required and the number of parts to be incorporated into the module is reduced to simplify the whole structure of the module accordingly and the facilitate the assembling of the module. Since the module is reduced by the thickness of the baseplate, the whole module 40 is accordingly reduced in thickness.

The module 40, thus assembled, is then disposed in the timepiece body 51. By this arrangement, the push button attached to the timepiece body 51 faces the switch member 21 of the circuit board 1 (FIGS. 10 and 11). Thus, a signal can be inputted/outputted through the switch member 21. Accordingly, a movable member for providing a switching operation is not required to be provided on the baseplate and hence the baseplate itself is rendered useless.

The present invention is not restricted to the above embodiments and many changes and modifications are possible. For example, in addition to the electronic timepiece described above, the present invention is applicable to electronic notebooks, personal computers, and modules of other electronic devices.

According to the present invention, a module or an electronic device which includes such module is assembled by engaging the second engaging means (hooks) formed in the housing with the first engaging means (holes) formed in the circuit board. Thus, no baseplate is required for assembling the module or electronic device. Accordingly, the number of parts of the module or electronic device is reduced and the whole module or electronic device is reduced in thickness.

What is claimed is:

1. A module comprising a circuit board and a housing within which the circuit board is disposed, wherein said circuit board comprises: (i) a plate-like metal core, (ii) an insulating layer formed on said core so as to cover said core, (iii) at least one circuit formed on said insulating layer, and (iv) a pair of first engaging means, each extending from a respective one of opposite ends of said core, for engaging with said housing; and wherein said housing includes a pair of second engaging means, each formed at a respective one of opposite ends of said housing, for engaging with said pair of first engaging means to connect said circuit board and said housing.

2. The module according to claim 1, wherein said circuit board includes a throughhole and a plurality of circuits formed on the insulating layer, and further comprises a conductor provided on an inner surface of said throughhole for electrically connecting respective ones of the plurality of circuits.

3. The module according to claim 1, wherein said circuit board further comprises a resilient switch member which is contactable with a fixed contact provided on a body of said circuit board; and wherein said switch member includes a core which, in turn, includes said metal core of said circuit board, and a movable contact formed at a position facing said fixed contact.

4. The module according to claim 3, wherein said circuit board includes a throughhole and a plurality of circuits formed on the insulating layer, and further comprises a conductor provided on an inner surface of said throughhole for electrically connecting respective ones of the plurality of circuits.

5. An electronic device comprising a main body and a module provided therein, wherein said module comprises a circuit board and a housing within which the circuit board is disposed, wherein said circuit board comprises: (i) a plate-like metal core, (ii) an insulating layer formed on said core so as to cover said core, (iii) at least one circuit formed on said insulating layer, and (iv) a pair of first engaging means, each extending from a respective one of opposite ends of said core, for engaging with said housing; and wherein said housing includes a pair of second engaging means, each formed at a respective one of opposite ends of said housing, for engaging with said pair of first engaging means to connect said circuit board and said housing.

6. The electronic device according to claim 5, wherein said circuit board includes a throughhole and a plurality of circuits formed on the insulating layer, and further comprises a conductor provided on an inner surface of said throughhole for electrically connecting respective ones of the plurality of circuits.

7. The electronic device according to claim 5, wherein said circuit board further comprises a resilient switch member which is contactable with a fixed contact provided on a body of said circuit board; and wherein said switch member includes a core which, in turn, includes said metal core of said circuit board, and a movable contact formed at a position facing said fixed contact.

8. The electronic device according to claim 7, wherein the circuit board includes a throughhole and a plurality of circuits formed on the insulating layer, and further comprises a conductor provided on an inner surface of said throughhole for electrically connecting respective ones of the plurality of circuits.

9. A module comprising a circuit board and a housing within which the circuit board is disposed, wherein said circuit board comprises: (i) a plate-like metal core, (ii) an insulating layer formed on said core so as to cover said core, (iii) at least one circuit formed on said insulating layer, and (iv) a pair of holes, each extending from a respective one of opposite ends of said core; and wherein said housing includes a pair of hooks, each formed at a respective one of opposite ends of said housing, for engaging with said pair of holes provided in said circuit board to connect said circuit board and said housing.

10. The module according to claim 9, wherein said circuit board includes a throughhole and a plurality of circuits formed on the insulating layer, and further comprises a conductor provided on an inner surface of said throughhole for electrically connecting respective ones of the plurality of circuits.

11. The module according to claim 9, wherein said circuit board further comprises a resilient switch member which is contactable with a fixed contact provided on a body of said circuit board; and wherein said switch member includes a core which, in turn, includes said metal core of said circuit board, and a movable contact formed at a position facing said fixed contact.

12. The module according to claim 11, wherein the circuit board includes a throughhole and a plurality of circuits formed on the insulating layer, and further comprises a conductor provided on an inner surface of said throughhole for electrically connecting respective ones of the plurality of circuits.

* * * * *